(12) United States Patent
Choi et al.

(10) Patent No.: US 8,194,014 B2
(45) Date of Patent: Jun. 5, 2012

(54) ORGANIC LIGHT EMITTING DISPLAY DEVICE

(75) Inventors: Sang-Moo Choi, Yongin (KR); Chul-Kyu Kang, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 369 days.

(21) Appl. No.: 12/686,117

(22) Filed: Jan. 12, 2010

(65) Prior Publication Data

US 2010/0265165 A1 Oct. 21, 2010

(30) Foreign Application Priority Data

Apr. 17, 2009 (KR) .................. 10-2009-0033570

(51) Int. Cl.
*G09G 3/30* (2006.01)
*G09G 3/10* (2006.01)
(52) U.S. Cl. .................. 345/80; 345/76; 315/169.3
(58) Field of Classification Search .............. 345/76–83, 345/694; 313/498–512, 463; 315/169.1–169.3
See application file for complete search history.

(56) References Cited

U.S. PATENT DOCUMENTS

2002/0047579 A1* 4/2002 Kunii et al. ............... 315/169.3

FOREIGN PATENT DOCUMENTS

| JP | 2008-033072 | 2/2008 |
|---|---|---|
| KR | 10-2003-0067467 | 8/2003 |
| KR | 10-2004-0082676 | 9/2004 |
| KR | 10-2005-0001517 | 1/2005 |
| KR | 1020050122694 A | 12/2005 |
| KR | 1020060055016 A | 5/2006 |

OTHER PUBLICATIONS

KIPO Office action dated Jul. 27, 2011, for Korean priority Patent application 10-2009-0033570, noting listed references in this IDS, 1 page.
Korean Patent Abstracts for Publication No. 10-2003-0067467, listed above, corresponding to Korean Patent 10-0730329 B1, dated Jun. 19, 2007.
Korean Patent Abstracts for Publication No. 10-2004-0082676, listed above, corresponding to Korean Patent 10-0486026 B1, dated Apr. 29, 2005.
Korean Patent Abstracts for Publication No. 10-2005-0001517, listed above, corresponding to Korean Patent 10-0928053 B1, dated Nov. 23, 2009.

* cited by examiner

*Primary Examiner* — Alexander Eisen
*Assistant Examiner* — Mark Regn
(74) *Attorney, Agent, or Firm* — Christie, Parker & Hale, LLP

(57) ABSTRACT

An organic light emitting display device capable of improving image quality on a large panel. The organic light emitting display device includes a panel divided into at least two regions including a first region crystallized by a first crystallization process and a second region crystallized by a second crystallization process, in which a boundary part of the first and second regions is subject to both the first crystallization process and the second crystallization process, and further includes: organic light emitting diodes at crossing regions of scan lines and data lines; and pixel circuits at the crossing regions and configured to supply currents to the organic light emitting diodes. Here, couplings between the pixel circuits within the first region and the boundary part and their respective organic light emitting diodes are different from couplings between the pixel circuits within the second region and their respective organic light emitting diodes.

8 Claims, 5 Drawing Sheets

ORGANIC LIGHT EMITTING DISPLAY DEVICE

CROSS-REFERENCE TO RELATED APPLICATIONS

This application claims priority to and the benefit of Korean Patent Application No. 10-2009-0033570, filed on Apr. 17, 2009, in the Korean Intellectual Property Office, the entire content of which is incorporated herein by reference.

BACKGROUND

1. Field

The following description relates to an organic light emitting display device.

2. Description of Related Art

Recently, various flat panel display devices, which are lighter in weight and smaller in size than a cathode ray tube display device, have been developed. Here, the flat panel display device may be a liquid crystal display device, a field emission display device, a plasma display panel display device, an organic light emitting display device, etc.

Among the flat panel display devices, the organic light emitting display device displays an image using organic light emitting diodes that generate light by recombination of electrons and holes. Such an organic light emitting display device can be driven with low power consumption, and at rapid response speed.

The organic light emitting display device is provided with pixels disposed in a matrix type pattern. The respective pixels display an image quality that may be predetermined, while controlling the amount of current supplied to the organic light emitting diodes corresponding to data signals. To this end, the respective pixels include a plurality of transistors.

The transistors generally include a semiconductor layer including a source region, a drain region, and a channel region; a gate electrode; a source electrode; and a drain electrode. The semiconductor layer is formed of polycrystalline silicon (Poly-si) or amorphous silicon (a-si). Most of the organic light emitting display devices currently use the polycrystalline silicon (Poly-si) having high electron mobility as the semiconductor layer.

The polycrystalline silicon is generated by forming and crystallizing amorphous silicon on a substrate. Here, various suitable methods may be used for crystallizing the amorphous silicon, such as an Excimer Laser Annealing (ELA) method. The ELA method crystallizes the amorphous silicon as the polycrystalline silicon by emitting laser thereto.

The process of crystallizing the amorphous silicon as the polycrystalline silicon by emitting laser thereto has a great influence on the characteristics of the transistors such as mobility and threshold voltage, etc. Therefore, laser should be emitted uniformly to the transistors.

An ELA crystallization equipment is manufactured to have a predetermined size. Here, when the transistors formed on a large panel are crystallized, laser is emitted thereto by dividing the regions of the panel. Here, a boundary part of the regions is subject to a two-time crystallization process (i.e., subject to a crystallization process and another crystallization process) due to margin errors, etc. of the ELA crystallization equipment. In other words, as shown in FIG. 1, the boundary part of the divided regions of the panel 2 is subject to the two-time crystallization process (i.e., subject to a laser emission and another laser emission). In this case, the characteristics of the transistors positioned on the boundary part 4 of the divided regions of the panel 2 is set to be different from those of the transistors positioned on regions other than the boundary part 4. Therefore, a problem arises in that an image having undesired noise shape is displayed on the boundary part 4 of the divided regions of the panel 2.

SUMMARY

An aspect of an embodiment of the present invention is directed toward an organic light emitting display device that can improve image quality on a large panel.

An embodiment of the present invention provides an organic light emitting display device that includes a panel divided into at least two regions including a first region crystallized by a first crystallization process and a second region crystallized by a second crystallization process, in which a boundary part of the first and second regions is subject to both the first crystallization process and the second crystallization process. The organic light emitting display device further includes: a scan driver configured to supply scan signals sequentially to scan lines; a data driver configured to supply data signals to data lines when the respective scan signals are supplied; organic light emitting diodes at crossing regions of the scan lines and the data lines; and pixel circuits at the crossing regions and configured to supply currents to the organic light emitting diodes, wherein couplings between the pixel circuits within the first region and within the boundary part and their respective organic light emitting diodes are different from couplings between the pixel circuits within the second region and their respective organic light emitting diodes.

In one embodiment, the first region is at an upper side of the boundary part, and the second side is at a lower side of the boundary part.

In one embodiment, the organic light emitting diodes within the first region and located on a current horizontal line are coupled to their respective pixel circuits located on a previous horizontal line.

In one embodiment, the pixel circuits within the boundary part are not coupled to the organic light emitting diodes within the boundary part.

In one embodiment, the organic light emitting diodes within the second region are coupled to their respective pixel circuits within the second region. Here, the organic light emitting diodes within the second region and their respective pixel circuits within the second region may be located on a same horizontal line.

Another embodiment of the present invention provides an organic light emitting display device that includes a panel divided into at least two regions including a first region crystallized by a first crystallization process and a second region crystallized by a second crystallization process, in which a boundary part of the first and second regions is subject to both the first crystallization process and the second crystallization process. The organic light emitting display device further includes: a scan driver configured to supply scan signals sequentially to scan lines; a data driver configured to supply data signals to data lines when the respective scan signals are supplied; organic light emitting diodes at crossing regions of the scan lines and the data lines; and pixel circuits at the crossing regions and configured to supply currents to the organic light emitting diodes. Here, the organic light emitting diodes within the boundary part are coupled to their respective pixel circuits located within regions other than the boundary part.

With the organic light emitting display device according to embodiments of the present invention, the organic light emitting display device included within the boundary part being subject to a two-time crystallization process (i.e., the first crystallization process and the second crystallization process) is coupled to the pixel circuit positioned on regions other than the boundary part. Also, the pixel circuit included within the boundary part is not coupled to the organic light emitting diodes within the boundary part. Therefore, the embodiments of the present invention can prevent noise in stripe shape from being generated.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
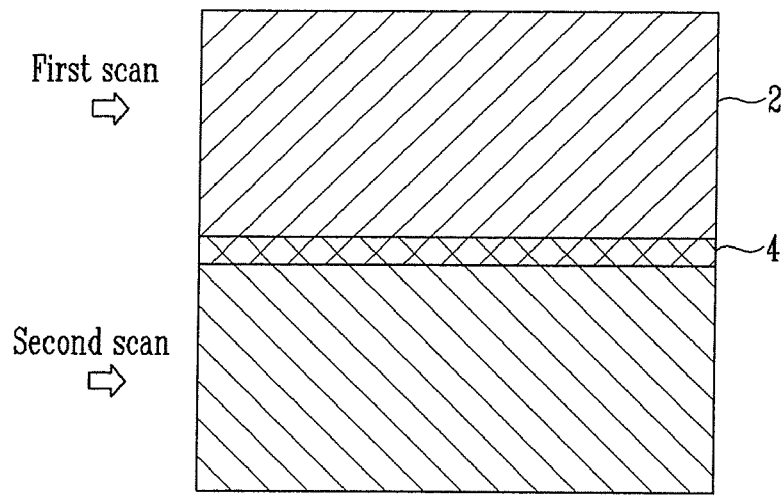
FIG. 1 is a schematic diagram showing a crystallization process of a large panel.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are not provided for clarity. Also, like reference numerals refer to like elements throughout.

Hereinafter, exemplary embodiments of the present invention, proposed so that a person having ordinary skill in the art can easily carry out the present invention, will be described in more detail with reference to the accompanying FIG. 2 to FIG. 6.

Figure 2:
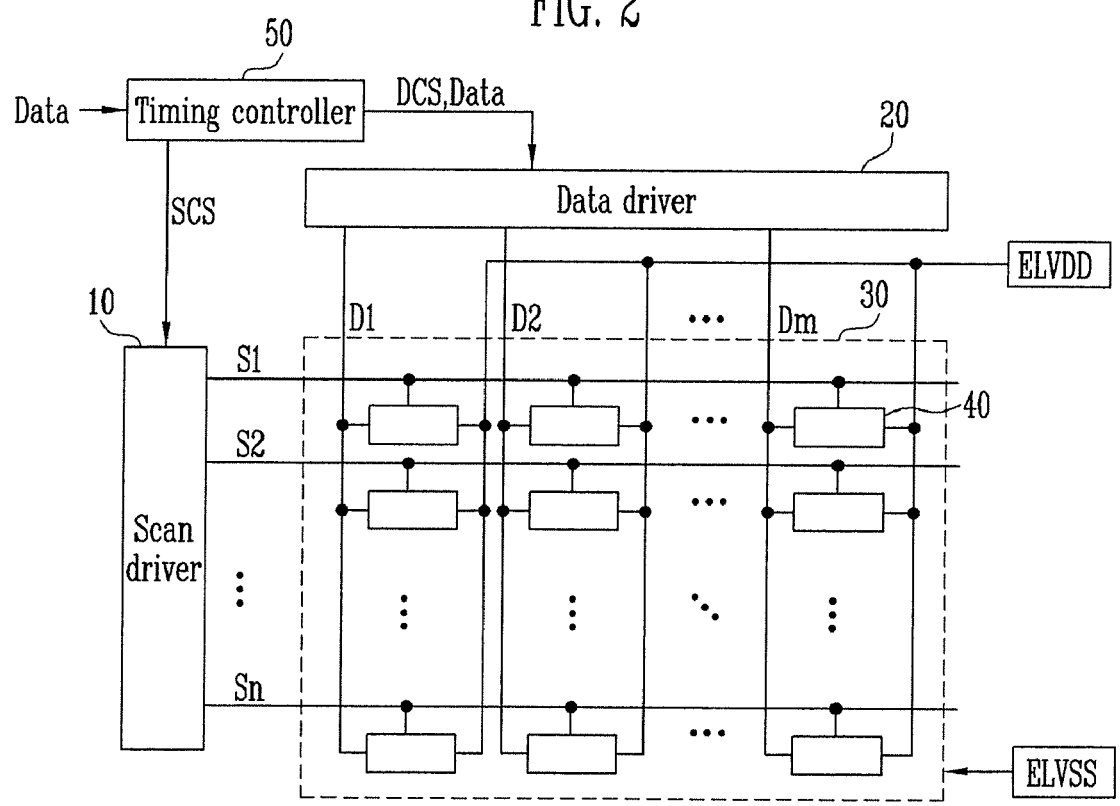
FIG. 2 is a schematic diagram showing an organic light emitting display device according to an embodiment of the present invention.

FIG. 2 is a schematic diagram showing an organic light emitting display device according to an embodiment of the present invention.

Referring to FIG. 2, the organic light emitting display device according to the embodiment of the present invention includes a panel 30 that includes a plurality of pixels 40 coupled to scan lines S1 to Sn and data lines D1 to Dm, a scan driver 10 that drives the scan lines S1 to Sn, a data driver 20 that drives the data lines D1 to Dm, and a timing controller 50 that controls the scan driver 10 and the data driver 20.

The panel 30 supplies a first power of a first power supply ELVDD and a second power of a second power supply ELVSS (e.g., the first power and second power being supplied from an external device) to the pixels 40. The pixels 40 receive the first power of the first power supply ELVDD and the second power of the second power supply ELVSS, and generate light having a brightness (e.g., a predetermined brightness) corresponding to the data signals input when the scan signals are supplied.

Here, the respective pixels 40 include an organic light emitting diode and a pixel circuit that controls the amount of current supplied to the organic light emitting diode. The pixel circuit includes at least one transistor and capacitor, and a driving transistor included in the pixel circuit controls the amount of current supplied from the first power supply ELVDD to the second power supply ELVSS via the organic light emitting diode, corresponding to the data signal.

Also, the panel according to the present invention, which is a large panel, is divided into at least two regions to be subject to a crystallization process. Here, the coupling between the pixel circuit and the organic light emitting diode is set to be partially different based on a boundary part to which laser is emitted twice. The detailed explanation thereof will be described later.

The scan driver 10 supplies scan signals sequentially to the scan lines S1 to Sn. If the scan signals are supplied sequentially to the scan lines S1 to Sn, the pixels 40 are selected sequentially in line unit.

The data driver 20 generates data signals using data Data supplied from the timing controller 50, and supplies the data signals to the data lines D1 to Dm whenever the scan signals are supplied. Then, the data signals are supplied to the pixels 40 selected by the scan signals.

The timing controller 50 generates a data driving control signal DCS and a scan driving control signal SCS corresponding to synchronization signals supplied from the external. The data driving control signal generated from the timing controller 50 is supplied to the data driver 20, and the scan driving control signal SCS generated therefrom is supplied to the scan driver 10. Also, the timing controller 50 rearranges the data Data supplied from the external to supply them to the data driver 20.

Figure 3:
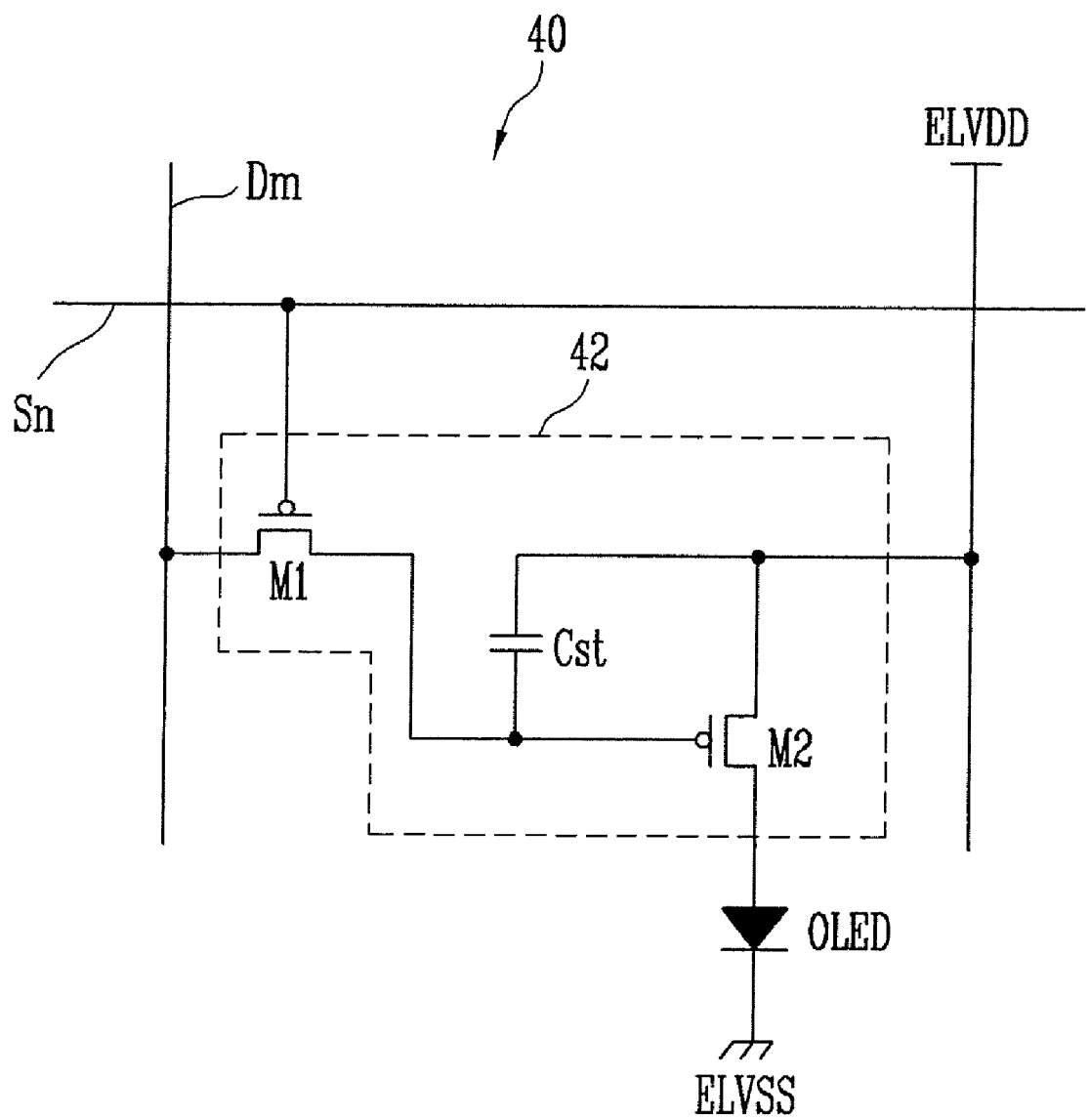
FIG. 3 is a schematic diagram showing an embodiment of the pixel of FIG. 2.

FIG. 3 is a schematic diagram showing an embodiment of the pixel of FIG. 2. FIG. 3 is for explaining the structure of the pixel so that the structure of the pixel circuit 42, and the coupling structure of the pixel circuit 42 and the organic light emitting diode OLED are not limited to FIG. 3.

Referring to FIG. 3, the pixel 40 of the organic light emitting display device according to the embodiment of the present invention includes the organic light emitting diode OLED and the pixel circuit 42 coupled to the data line Dm and the scan line Sn to control the organic light emitting diode OLED.

The anode electrode of the organic light emitting diode OLED is coupled to the pixel circuit 42, and the cathode electrode thereof is coupled to the second power supply ELVSS. Such a pixel circuit 42 controls the amount of current supplied to the organic light emitting diode OLED corresponding to the data signal supplied to the data line Dm when the scan signal is supplied to the scan line Sn. To this end, the pixel circuit 42 includes a second transistor M2 coupled between the first power supply ELVDD and the organic light emitting diode OLED, a first transistor coupled among the second transistor M2, the data line Dm, and the scan line Sn, and a storage capacitor Cst coupled between the gate electrode and the first electrode of the second transistor M2.

The gate electrode of the first transistor M1 is coupled to the scan line Sn, and the first electrode thereof is coupled to the data line Dm. Also, the second electrode of the first transistor M1 is coupled to one side terminal of the storage capacitor Cst. Here, the first electrode is the source electrode or the drain electrode, and the second electrode is set to an electrode other than the electrode of the first electrode. For example, if the first electrode is the source electrode, the second electrode is the drain electrode. The first transistor M1 coupled to the scan line Sn and the data line Dm is turned on when the scan signal is supplied from the scan line Sn to supply the data signal supplied from the data line Dm to the storage capacitor Cst. Here, the storage capacitor Cst is charged with the voltage corresponding to the data signal.

The gate electrode of the second transistor M2 is coupled to one side terminal of the storage capacitor Cst, and the first electrode thereof is coupled to the other side terminal of the storage capacitor Cst or the first power supply ELVDD. In addition, the second electrode of the second transistor M2 is coupled to the anode electrode of the organic light emitting diode OLED. Such a second transistor M2 controls the amount of current flowing from the first power supply ELVDD to the second power supply ELVSS via the organic light emitting diode OLED corresponding to the voltage values stored in the storage capacitor Cst. Here, the organic light emitting diode OLED generates light corresponding to the amount of current supplied from the second transistor M2.

Figure 4:
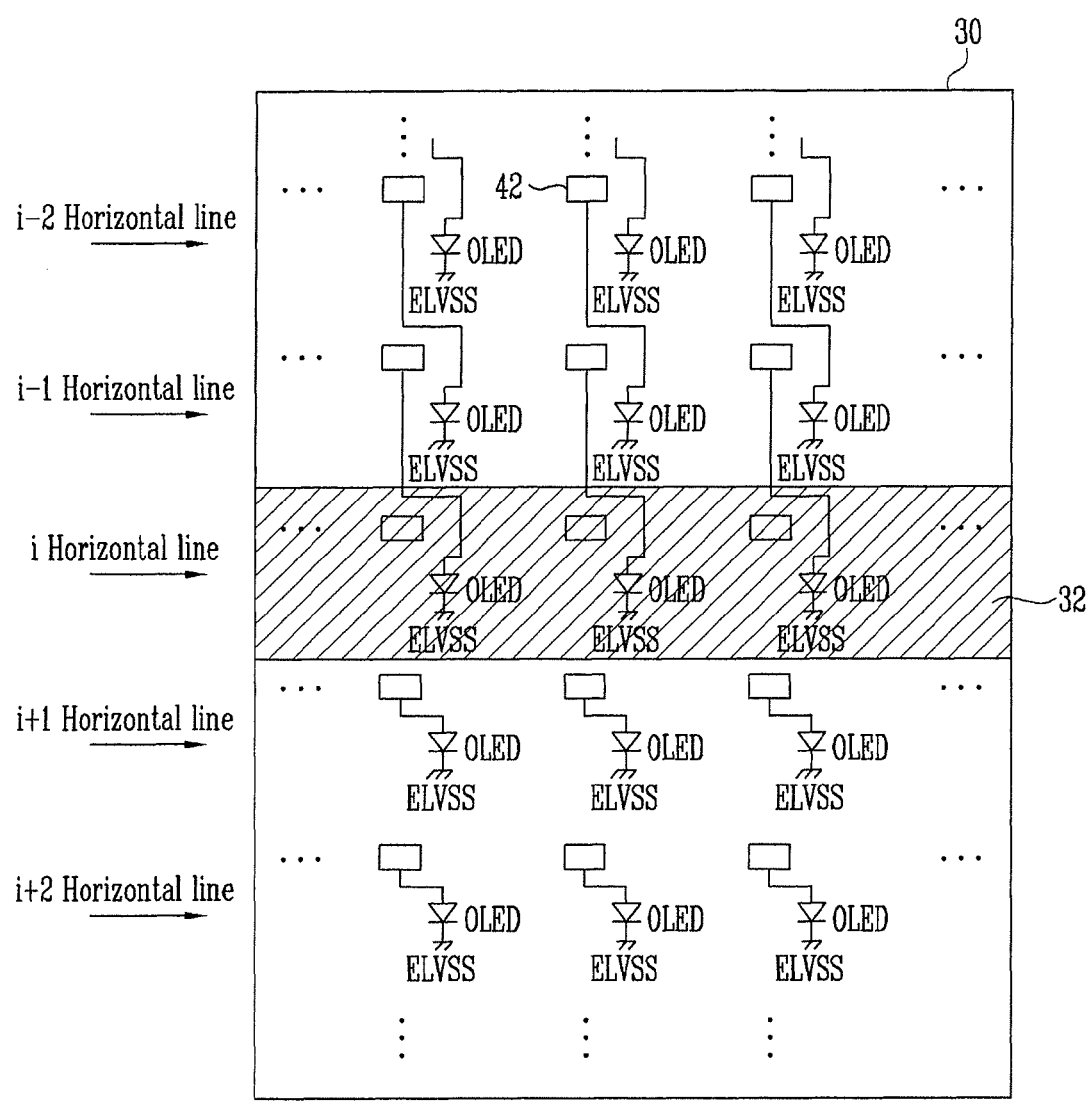
FIG. 4 is a schematic diagram showing a coupling relation between a pixel circuit and organic light emitting diodes based on a boundary part in the organic light emitting display device according to an embodiment of the present invention.

FIG. 4 is a schematic diagram showing an embodiment of a coupling relation between a pixel circuit and organic light emitting diodes based on a boundary part in the organic light emitting display device according to the present invention. For convenience of explanation, in FIG. 4, it is assumed that laser for crystallization is overlapped on one horizontal line.

Referring to FIG. 4, the organic light emitting diodes OLED positioned on divided regions of the panel 30 are coupled electrically to the pixel circuits 42 positioned on previous horizontal lines. In other words, the organic light emitting diodes OLED positioned on the $i^{th}$ (i is a natural number) horizontal line, which is the boundary part 32, receive current from the pixel circuits 42 positioned on the $i-1^{st}$ horizontal line. Also, the organic light emitting diodes OLED positioned on the $i-1^{st}$ horizontal line receive current from the pixel circuits 42 positioned on the $i-2^{nd}$ horizontal line. In other words, the organic light emitting diodes OLED positioned on an upper side (a first side) including the boundary part 32 are coupled to the pixel circuits 42 positioned on the previous horizontal line.

In addition, the organic light emitting diodes OLED positioned on a lower side (a second side) of the boundary part 32 are coupled to the pixel circuits 42, the organic light emitting diodes OLED and the pixel circuits 42 being positioned on the same horizontal line. In other words, the organic light emitting diodes OLED positioned on the $i+1^{st}$ horizontal line receive current from the pixel circuits 42 positioned on the $i+1^{st}$ horizontal line.

As described above, the organic light emitting diodes positioned on the boundary part 32 receive current from the pixel circuit 42 positioned on regions other than the boundary part 32. Also, the pixel circuits 42 positioned on the boundary part 32 are not coupled to the organic light emitting diodes OLED. Therefore, an embodiment of the present invention can prevent or reduce image having noise shape from being displayed on the boundary part 32.

In other words, the boundary part 32 in the divided regions of the panel 30 is subject to the two-time crystallization process (i.e., subject a crystallization process and another crystallization process). In this case, the characteristics of the transistors included in the pixel circuit 42 positioned on the boundary part 32 are set to be different from the characteristics of the transistors poisoned on regions other than the boundary part. Therefore, an embodiment of the present invention controls the pixel circuits 42 positioned on the boundary part 32 not to be coupled to the organic light emitting diodes OLED, thereby making it possible to improve image quality.

Figure 5:
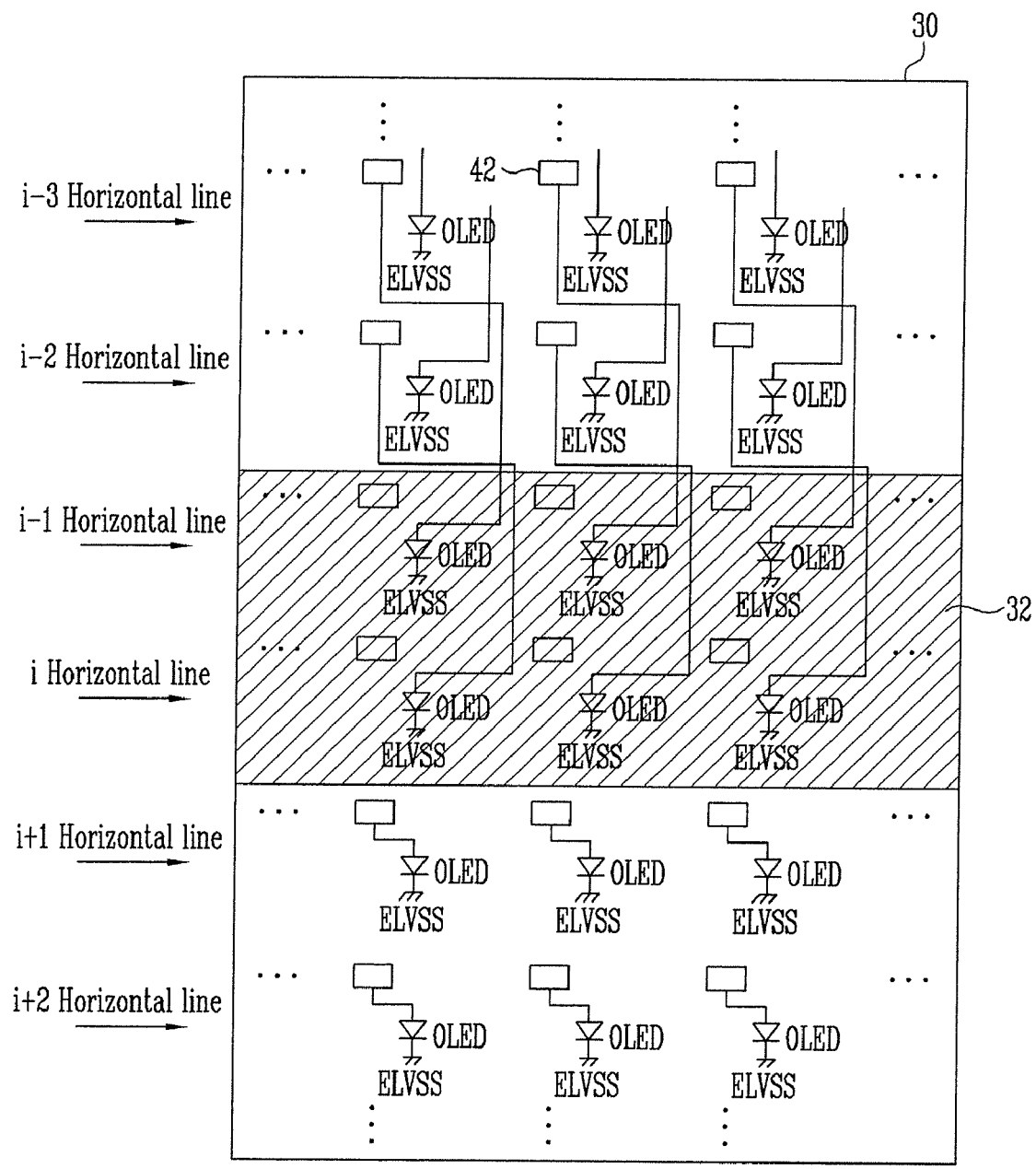
FIG. 5 is a schematic diagram showing a coupling relation between a pixel circuit and organic light emitting diodes based on a boundary part in the organic light emitting display device according to another embodiment of the present invention.

Also, in FIG. 4, it is assumed that only one horizontal line is included in the boundary part 32, however, the present invention is not limited thereto. For example, two horizontal lines may be included in the boundary part 32, as shown in FIG. 5. Here, as described above, the organic light emitting diodes OLED positioned on the boundary part 32 are coupled electrically to the pixel circuits 42 positioned on the previous horizontal line.

In other words, the organic light emitting diodes OLED positioned on the $i^{th}$ horizontal line of the boundary part 32 receive current from the pixel circuits 42 positioned on the $i-2^{nd}$ horizontal line, and the organic light emitting diodes OLED positioned on the $i-1^{st}$ horizontal line receive current from the pixel circuits 42 positioned on the $i-3^{rd}$ horizontal line. In addition, the organic light emitting diodes OLED included in the lower side of the boundary part 32 are coupled electrically to the pixel circuits 42, the organic light emitting diodes OLED and the pixel circuits being positioned on the same horizontal line. In this case, current is not supplied from the pixel circuits 42 positioned on the boundary part 32 to the organic light emitting diodes OLED and thereby, making it possible to prevent image having noise shape from being displayed on the boundary part 32.

Figure 6:
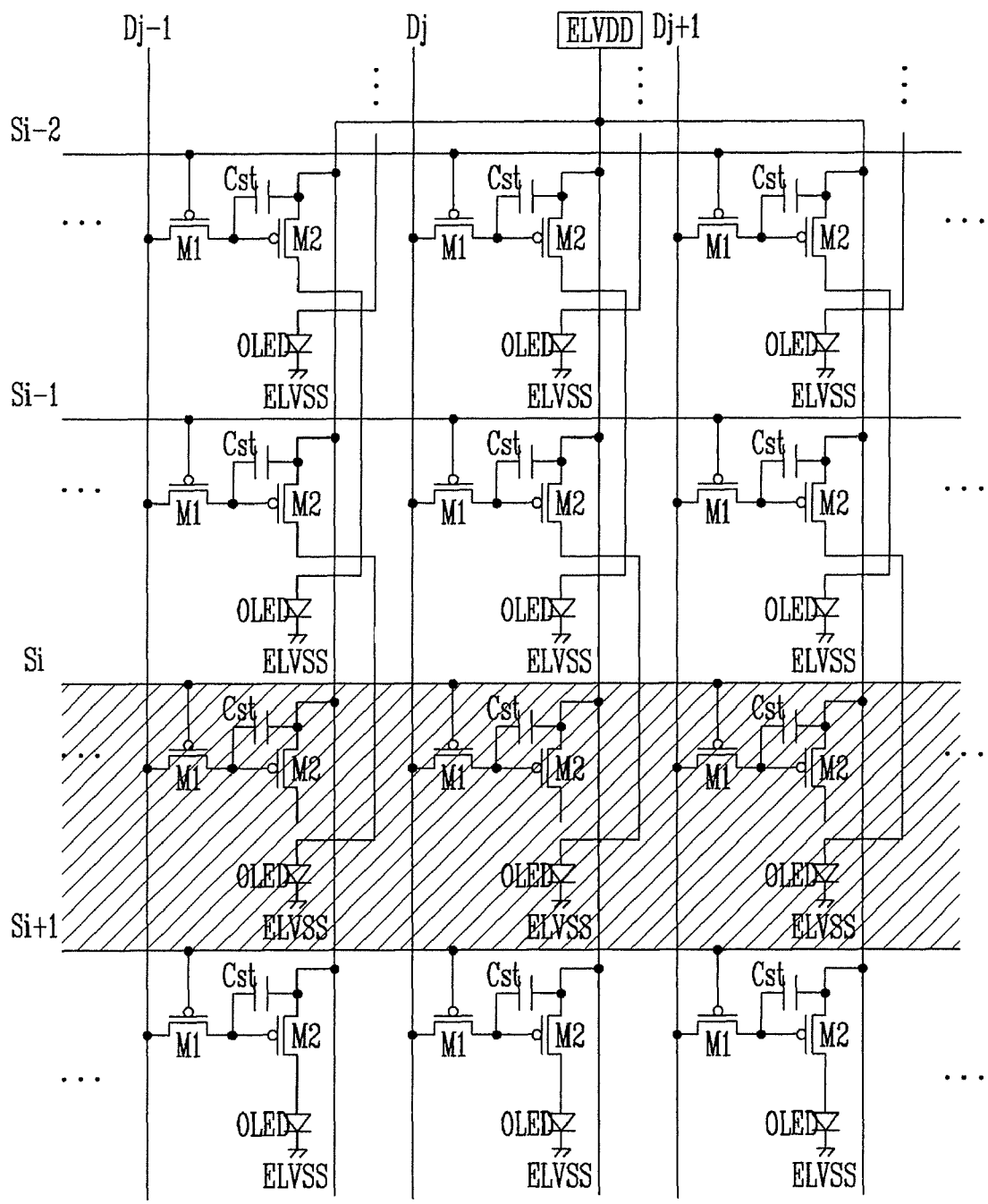
FIG. 6 is a schematic diagram showing a coupling between the organic light emitting diodes including a circuit structure of the pixel circuit and the pixel circuit in the organic light emitting display device of FIG. 4.

FIG. 6 is a schematic diagram showing a coupling between the organic light emitting diodes including a circuit structure of the pixel circuit and the pixel circuit in the organic light emitting display device of FIG. 4.

Referring to FIG. 6, the driving transistors M2 positioned on the upper side including the boundary part 32 are coupled to the organic light emitting diodes OLED positioned on the next horizontal line. In addition, the driving transistors M2 positioned on the lower side of the boundary part 32 are coupled to the organic light emitting diodes OLED, the driving transistors M2 and the organic light emitting diodes OLED being positioned on the same horizontal line. In this case, the driving transistors M2 included in the boundary part 32 are not coupled to the organic light emitting diodes and thereby, making possible to prevent or reduce image having noise shape from being displayed.

While the present invention has been described in connection with certain exemplary embodiments, it is to be understood that the invention is not limited to the disclosed embodiment, but, on the contrary, is intended to cover various modifications and equivalent arrangements included within the spirit and scope of the appended claims, and equivalents thereof.

What is claimed is:

1. An organic light emitting display device comprising a panel divided into at least two regions comprising a first region crystallized by a first crystallization process and a second region crystallized by a second crystallization process, in which a boundary part of the first and second regions is subject to both the first crystallization process and the second crystallization process, the organic light emitting display device comprising:

a scan driver configured to supply scan signals sequentially to scan lines;

a data driver configured to supply data signals to data lines when the respective scan signals are supplied;

organic light emitting diodes at crossing regions of the scan lines and the data lines; and pixel circuits at the crossing regions and configured to supply currents to the organic light emitting diodes, wherein couplings between the pixel circuits within the first region and within the boundary part and their respective organic light emitting diodes are different from couplings between the pixel circuits within the second region and their respective organic light emitting diodes.

2. The organic light emitting display device as claimed in claim 1, wherein the first region is at an upper side of the boundary part, and the second region is at a lower side of the boundary part.

3. The organic light emitting display device as claimed in claim 1, wherein the organic light emitting diodes within the first region and located on a current horizontal line are coupled to their respective pixel circuits located on a previous horizontal line.

4. The organic light emitting display device as claimed in claim 3, wherein the pixel circuits within the boundary part are not coupled to the organic light emitting diodes within the boundary part.

5. The organic light emitting display device as claimed in claim 1, wherein the organic light emitting diodes within the second region are coupled to their respective pixel circuits within the second region.

6. The organic light emitting display device as claimed in claim 5, wherein the organic light emitting diodes within the second region and their respective pixel circuits within the second region are located on a same horizontal line.

7. An organic light emitting display device comprising a panel divided into at least two regions comprising a first region crystallized by a first crystallization process and a second region crystallized by a second crystallization process, in which a boundary part of the first and second regions is subject to both the first crystallization process and the second crystallization process, the organic light emitting display device comprising:

a scan driver configured to supply scan signals sequentially to scan lines;

a data driver configured to supply data signals to data lines when the respective scan signals are supplied;

organic light emitting diodes at crossing regions of the scan lines and the data lines; and pixel circuits at the crossing regions and configured to supply currents to the organic light emitting diodes, wherein the organic light emitting diodes within the boundary part are coupled to their respective pixel circuits located within regions other than the boundary part.

8. An organic light emitting display device comprising a panel divided into at least two regions comprising a first region crystallized by a first crystallization process and a second region crystallized by a second crystallization process, in which a boundary part of the first and second regions is subject to both the first crystallization process and the second crystallization process, the organic light emitting display device comprising:

a scan driver configured to supply scan signals sequentially to scan lines;

a data driver configured to supply data signals to data lines when the respective scan signals are supplied;

organic light emitting diodes at crossing regions of the scan lines and the data lines; and pixel circuits at the crossing regions and configured to supply currents to the organic light emitting diodes, wherein the pixel circuits within the boundary part are not coupled to the organic light emitting diodes within the boundary part.

* * * * *